WAVEGUIDE SWITCH WITH SEMICONDUCTOR IN THERMAL CONTACT WITH WAVEGUIDE WALLS
Filed June 28, 1965 3 Sheets-Sheet 1
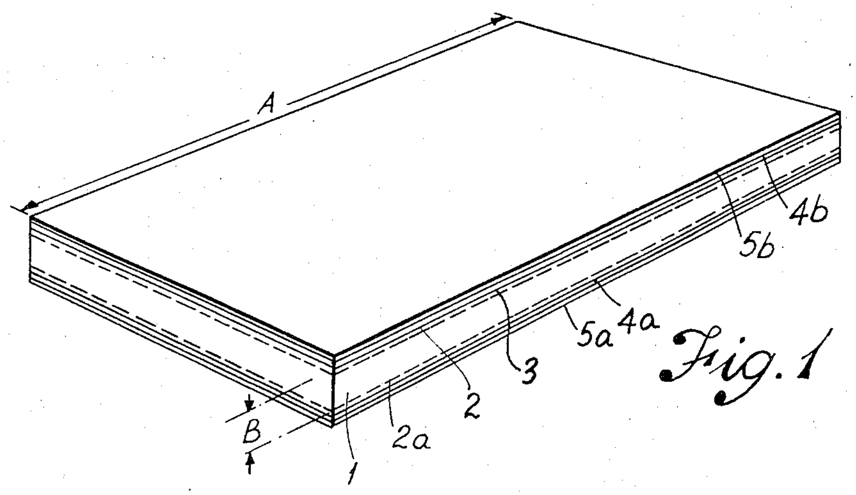
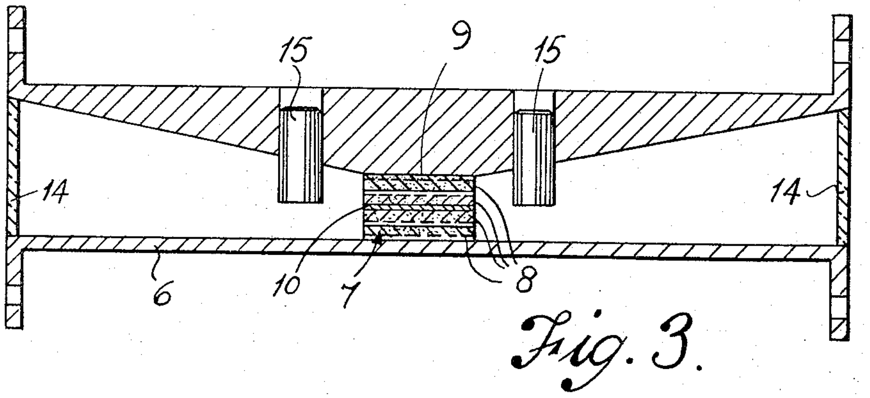
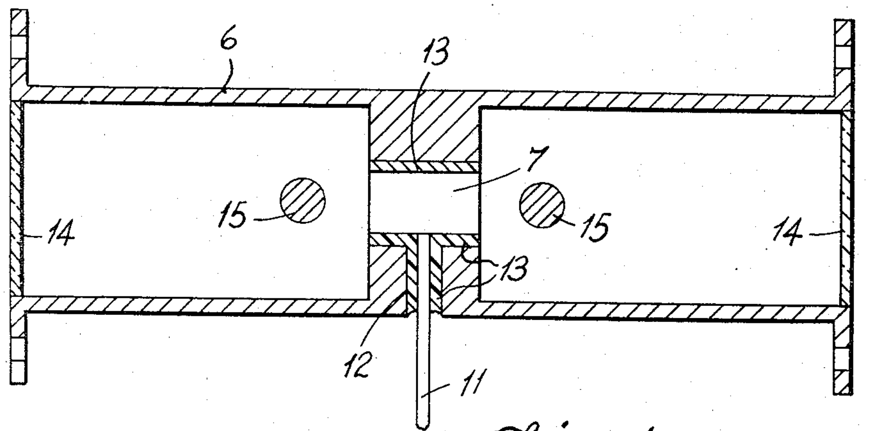
Fig. 4
INVENTORS
WILLIAM JOSEPH SCOTT
NORMAN ROBERT HOWARD
BY
Bowyer & Witherspoon
ATTORNEYS Fig. 2.
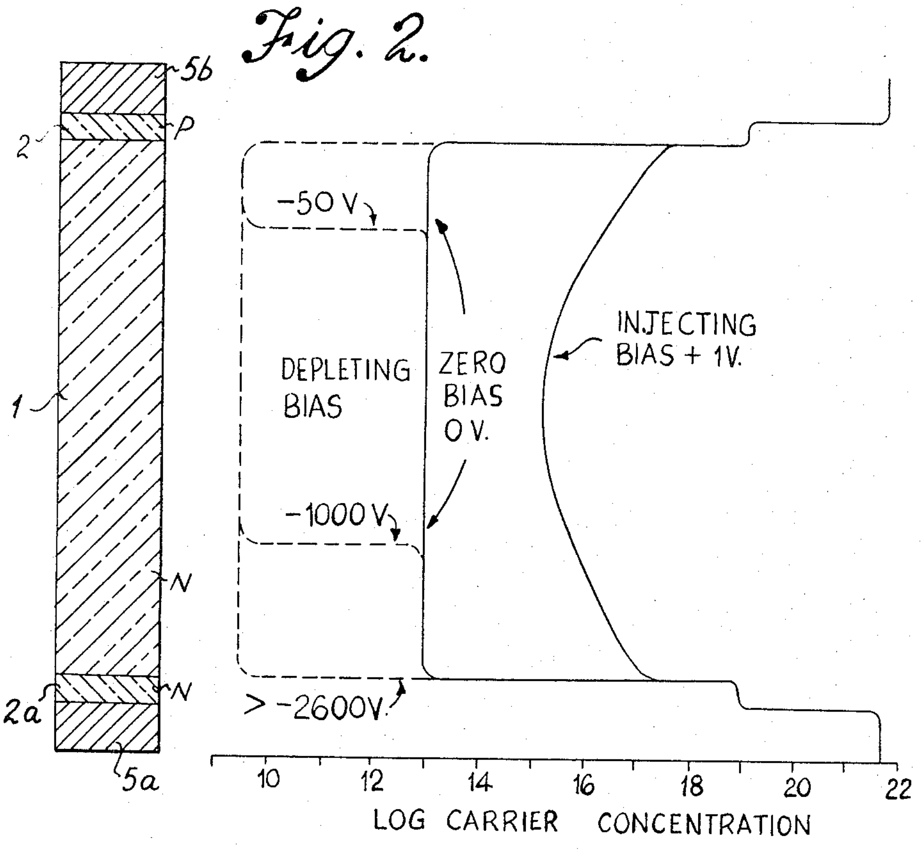
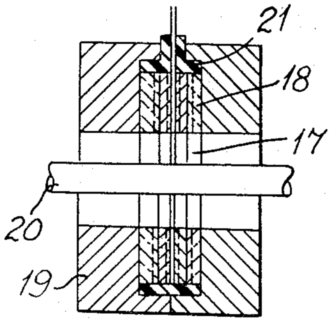
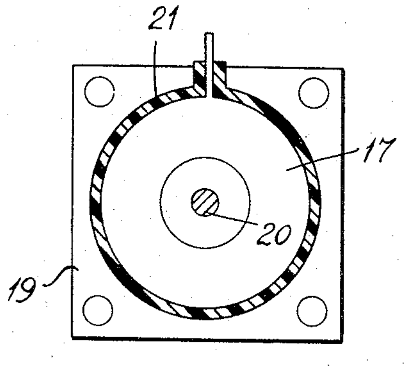
Fig. 5. Fig. 6.
INVENTORS
WILLIAM JOSEPH SCOTT
NORMAN ROBERT HOWARD
BY
Sawyer & Witherspoon
ATTORNEYS Oct. 10, 1967 W. J. SCOTT ETAL 3,346,825

WAVEGUIDE SWITCH WITH SEMICONDUCTOR IN THERMAL CONTACT WITH WAVEGUIDE WALLS

Filed June 28, 1965 3 Sheets-Sheet 3

INVENTORS
WILLIAM JOSEPH SCOTT
NORMAN ROBERT HOWARD
BY
Bowyer & Witherspoon
ATTORNEYS

United States Patent Office 3,346,825

Patented Oct. 10, 1967

3,346,825

WAVEGUIDE SWITCH WITH SEMICONDUCTOR IN THERMAL CONTACT WITH WAVEGUIDE WALLS

William Joseph Scott and Norman Robert Howard, Rugby, England, assignors to Associated Electrical Industries Limited, London, England, a company of Great Britain Filed June 28, 1965, Ser. No. 467,281
22 Claims. (Cl. 333—98)

ABSTRACT OF THE DISCLOSURE

A micro-wave device including a section of waveguide or coaxial line has a semiconductor variable impedance element associated therewith which serves to control the flow of micro-wave energy therethrough. In exemplary arrangements the semi-conductor junction element comprises a body of high resistivity semi-conductor material of one conductivity type having a pair of surface regions each including one of respective polarity semi-conductor material on opposite faces of the body, said regions being of high electrical conductivity of P and N conductivity type respectively with a PN junction between said high resistivity material and the surface region of opposite conductivity type and with each of the faces covered by a layer of electrically conductive material which serves as a contact to the element with the element mounted in the section of waveguide or coaxial line with at least one face of the element in thermal contact with a wall of the waveguide or the outer conductor of the line and means are provided for applying bias voltages of suitable polarity and magnitude between the contacts of the element to vary the impedance thereof so that the element controls the flow of micro-wave energy and the heat energy developed in the element is dissipated by being passed to the wall of the waveguide or the outer conductor of the line.

This invention relates to micro-wave devices comprising a semi-conductor variable impedance junction element mounted in a section of waveguide or of coaxial line with said element serving to control the flow of micro-wave energy therethrough.

In such devices the impedance of the semi-conductor element is controlled by altering the polarity and/or magnitude of a biasing voltage which is applied across the junction or junctions. Typically when the element is in one of its extreme impedance conditions it allows maximum energy to flow along the waveguide or coaxial line, but when the element is switched to its other extreme impedance condition substantially none of the energy is allowed to pass. During the operation of the device the temperature of the semi-conductor is raised due to the energy which is absorbed thereby and the amount of micro-wave energy which the device is capable of controlling is determined to a considerable extent by the maximum temperature which the semi-conductor element can withstand without breakdown, and it is an object of the present invention to increase the power rating of such devices without increasing the temperature of the semi-conductor element beyond this upper limit.

According to the present invention, a micro-wave device comprises a semi-conductor junction element mounted in a section of waveguide or coaxial line in thermal contact with at least one wall of the waveguide or line, together with means for applying bias voltages of suitable polarity and magnitude across said junction element to control the impedance of the element to required values between two extreme conditions in which the element is highly conductive and highly resistive, respectively, such that during the operation of the device in the first extreme condition of the element the penetration of micro-wave energy is substantially confined to a minor proportion of the element and the major proportion thereof constitutes a thermally conductive path to the wall(s) of the waveguide or coaxial line for heat produced by micro-wave energy dissipated in the minor proportion of the element, and in the second extreme condition a proportion of the element is substantially depleted of current carriers so that the micro-wave energy passes therethrough with substantially negligible absorption.

The semi-conductor variable impedance junction element may comprise one or more wafers of semi-conductor material and each consists of either n-type or p-type material of resistivity typically between 10 and 10,000 ohm. cms., but higher values are also envisaged, on one main face of which is provided an electron injecting layer, for example a layer of n-type material of resistivity below 1 ohm.cm., and on the other main face of which there is a hole injecting layer, for example a layer of p-type material of resistivity below 1 ohm.cm. with metallic terminals to each of the injecting layers. The element is of such dimensions and is so placed in the circuit that the flow of micro-wave energy therethrough is controlled by a minor proportion of the element, while the major proportion, although screened from the radio frequency power by the minor proportion, acts as a thermally conductive path for heat produced by micro-wave energy dissipated within the minor proportion. Electrical losses in the element when it is in its low electrical conductivity state are reduced to a desired level by applying a high voltage bias (50–50,000 volts) between the terminals or contacts so as to substantially deplete all or a sufficiently large part of the central high resistivity portion(s) of the wafer(s) of current carriers. When a small bias voltage, for example 1 volt, is applied between the contacts with the polarity of the bias being such that current carriers are injected into the semi-conductor material, the element becomes an efficient electrical conductor and the electrical impedance of the device is altered. Values of bias intermediate or other than the values mentioned above may be used if desired to produce non-extreme switching or attenuating conditions, and the period over which each value of bias is applied may be adjusted to suit particular applications of the device.

The element may comprise a single body or wafer of semi-conductor material with a pair of injecting layers located on generally opposite flat or curved or cylindrical faces thereof, or alternatively it may comprise a plurality of semi-conductor wafers each of which has a pair of injecting layers and arranged in the form of a stack with the pairs of dissimilar contacts of adjacent wafers in contact. When a plurality of wafers are employed the bias voltage may be applied to the element through a conductor which is secured to a conductive plate symmetrically disposed between two wafers or two similar stacks of wafers, the wafers being arranged such that current flow between the central conductive plate and the opposite walls of the waveguide or coaxial line is in two parallel paths. Any other convenient series parallel arrangement may be used.

In order that the invention may be more readily understood it will now be described with reference to the accompanying drawings in which:

FIG. 1 is a perspective view of a semi-conductor element for use in a section of waveguide in accordance with the invention.

FIG. 2 shows in diagrammatic form the distribution of current carriers within the element shown in FIG. 1 when various bias voltages are applied thereto;

FIG. 3 is a section through a waveguide and an element in accordance with a second embodiment of the invention;

FIG. 4 is a sectional plan of the embodiment shown in FIG. 3;

FIG. 5 is a sectional side elevation of an element mounted in a coaxial line;

FIG. 6 is a sectional end elevation of the arrangement shown in FIG. 5;

Figure 7:
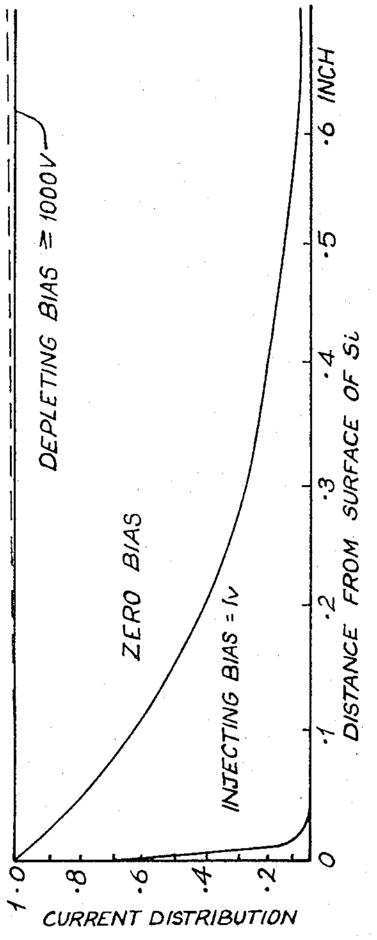
FIG. 7 shows diagrammatically the current distribution in a body of silicon for various values of bias.

A semi-conductor element suitable for mounting in a section of rectangular waveguide is shown in FIG. 1. The element comprises a single crystal of silicon of generally rectangular form having a major dimension A and a minor dimension B, the dimension at right angles to A and B may be major, minor or intermediate with the major dimension A being considerably greater than the minor dimension B. The length A of the element is approximately equal to one half guide wavelength of the micro-wave energy to be controlled by the device as determined for the high resistivity condition. The central layer 1 may be of n-type silicon and has a conductivity of between 50 and 5000 ohms./cms., and a layer 2 of silicon of the opposite conductivity type, for example 0.01 ohm./cm., resistivity is located at one face of the crystal. The resulting p-n junction 3 extends substantially parallel to the main face of the crystal and is normal to the dimension B. At the opposite face the crystal has a thin electron injecting layer *2a* consisting of n-type silicon of high conductivity and the outer-surfaces of the two layers are each covered by consecutive layers of nickel *4a* and *4b* and optionally solder *5a* and *5b* respectively to form contacts with good electrical and thermal conductivities. Alternatively each nickel face may be lapped flat for mounting by a clamping method in which case the solder may be omitted.

The element is mounted in a section of metal waveguide either alone or with others with the dimension A arranged in the direction of propagation of the micro-wave energy, and the dimension B in the general direction of the electric field in the element with at least one of the metallic faces in good thermal contact with a face of the waveguide. A bias voltage is applied to the contacts of the element and when a forward bias of about 1 volt is applied thereto electrons are injected from the layer *2a* and holes from layer 2 into the central layer 1. The carrier concentration across the central layer is shown in FIG. 2 and it will be seen that the density of carriers varies from between $10^{17}$ at the edges to about $10^{15}$ in the centre. This carrier density is made up of substantially equal numbers of electrons and holes so that the net charge density in the layer 1 remains substantially zero. The decrease in density from the edges to the centre is due to the recombination of electrons and holes and in order for the decrease to be as small as possible the ratio of diffusion length of carriers to the thickness of the layer 1 must be as large as possible. In the example shown this ratio is approximately 0.1. With a reverse bias applied to the contacts, part of the central layer 1 is substantially depleted of carriers and the density can fall below $10^{10}$ per cubic cm. In the examples shown a voltage of at least 2600 volts is needed to deplete the entire layer 1 as shown in broken lines and the depleted regions with bias voltages of 1000 volts and 50 volts respectively are also indicated.

FIGS. 3 and 4 show a section of waveguide 6 which is provided with a semi-conductor variable impedance element 7 which comprises a plurality of individual wafers 8 mounted as by clamping and/or soldering in a narrowed section or iris 9 of the waveguide and each of the wafers may be similar to the element shown in FIG. 1. The bias voltage to the element is applied between an electrically conductive metal plate 10 which is symmetrically disposed between two wafers or two stacks of wafers 8 and the opposite faces of the waveguide. The voltage is applied to the metal plate 10 by means of a conductor 11 which is connected to the plate and extends in insulating relation through an opening 12 in one of the narrow walls of the waveguide. To prevent the wafers from being short-circuited the side walls of the stacks are insulated from the adjacent walls of the waveguide by an air gap and/or a body of insulation 13. Windows 14 of dielectric material may be used to seal hermetically each end of the section of waveguide to prevent pollution of the element. The element may be matched into the waveguide with the aid of a pair of matching stubs 15 which are well-known in the art.

The low thermal impedance of the large volume of the element between the relatively large areas of contact between the element and the walls of the waveguide, and to the small volume of the element in which heat is developed by the micro-wave energy, ensures that the heat is rapidly conducted away from the element to the waveguide and this enables the element to control a considerable quantity of micro-wave energy without the temperature of the element rising to an undesirable level.

FIGS. 5 and 6 illustrate an embodiment of the invention as applied to a coaxial line. The element comprises two symmetrical stacks 17 each of one or more annular disc shaped wafers, and the stacks are mounted in an annular recess 18 formed in the outer member 19 of the coaxial line. The inner conductor 20 of the coaxial line extends through the central opening of the element and is not in contact with the wafers. The peripheral edge of the element is prevented from coming into contact with the wall of the recess 18 by means of a layer 21 of electrically insulating material. The radial width of the element may be made equal to approximately one-quarter guide wavelength so that the short annular waveguide when the element is in its extreme conducting condition allows micro-wave energy to pass freely along the line, but acts as a rejector circuit when the element is in its extreme insulating condition. The edges of the junction may be protected with a silicone varnish or otherwise.

A similar arrangement (not shown) which omits conductor 20 may be used to control the impedance of a waveguide of circular or other cross-section.

A plurality of elements may be combined in one device to give wide band-pass or other electrical characteristics.

FIGURE 7 shows the penetration of X-band ($10^{10}$ c./s.) currents through silicon with carrier densities of $10^{16}$ per cc. of about $10^{14}$ per cc. and $10^{9}$ per cc. which corresponds to biases of one volt forward, zero and 2600 volts reverse. It is clear that substantial losses would occur in silicon samples more than .05" thick if no reverse bias were applied but with reverse bias silicon upwards of 1" in thickness could be used. It will also be observed that with forward bias of 1 volt the major absorption of microwave power will be confined to a layer about .01" thick.

Figure 8:
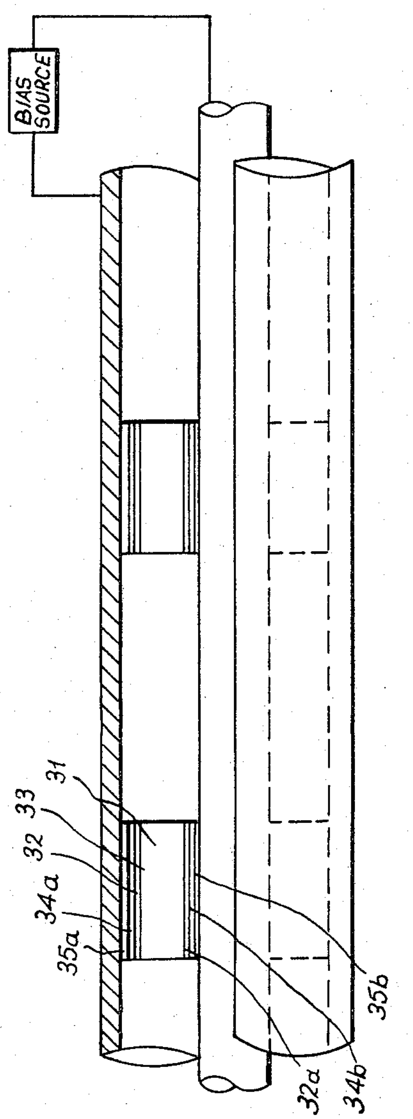
FIG. 8 is a part sectional side elevation of a coaxial line having two elements mounted therein.

FIG. 8 shows an alternative embodiment of the invention in which two similar elements are mounted electrically in parallel in a section of coaxial line. Each element comprises a hollow cylindrical body 31 of semi-conductor material, conveniently silicon, having layers 32, *32a* of silicon of high conductivity and of the opposite conductivity type and the same conductivity type on its outer and inner curved surfaces respectively.

The resulting P-N junction 33 between the body and the layer 32 is in the form of an annular sleeve which extends with its axis substantially parallel to the axis of the body. The inner and outer layers *32a* and 32 respectively are each provided with consecutive layers of nickel *34b* and *34a* respectively and solder *35b* and *35a* respectively to form contacts of good electrical and thermal conductivities.

The elements are mounted in the section of coaxial line with the outer solder layer in contact with the inner surface of the outer conductor 36 of the line and with the inner solder layer in contact with the inner conductor 37 of the line. Bias is applied to the element from a bias source 38 through the inner and outer conductors of the line to which conductors the bias is connected.

The semiconductor element may be mounted in the waveguide or coaxial line by soldering one or both of the outer terminals of the element to the respective wall of the waveguide or line. Alternatively the or each terminal may be lapped free from undulations and clamped to the wall by means of a conductive metal clamp which preferably has a similar co-efficient of thermal expansion to that of the semiconductor material.

The section of waveguide or coaxial line containing the element is conveniently hermetically sealed and may be either evacuated or filled with a protective atmosphere for example nitrogen. The conductor for applying bias to the element is hermetically sealed in an insulating manner through the wall. The end or ends of the waveguide or line through which the micro-wave power enters and leaves the waveguide or line is hermetically sealed with a solid dielectric material.

What we claim is:

1. A microwave device comprising a section of waveguide, a semiconductor junction element, said element comprising a body of high resistivity semiconductor material of one conductivity type having a pair of surface regions each including one of respective opposite faces of the body, said regions being of high electrical conductivity of P and N conductivity type respectively with a PN junction between said high resistivity material and the surface region of opposite conductivity type and with each of said faces covered by a layer of electrically conductive material which serves as a contact to the element, with the element mounted in the section of waveguide with one face of the element in thermal contact with a wall of said waveguide, and means for applying bias voltages of suitable polarity and magnitude between said contacts to control the impedance of the element to required values between two extreme conditions in which the element is highly conductive and highly resistive respectively, such that during the operation of the device in the first extreme condition of the element the penetration of microwave energy is substantially confined to a minor proportion of the element and the major proportion thereof constitutes a thermally conductive path to the wall of the waveguide for heat produced by microwave energy dissipated in the minor proportion of the element, and in the second extreme condition a proportion of the element is substantially depleted of current carries so that the microwave energy passes therethrough with substantially negligible absorption.

2. A microwave device as claimed in claim 1 in which said element comprises at least two similar wafers each of semiconductor high resistivity material having a pair of surface regions each including one of respective opposite faces of the wafer, said regions being of high electrical conductivity of P and N conductivity type respectively with each of said faces supporting a layer of electrically conductive material which serves as a terminal of the wafer, with said wafers arranged electrically in series in a stack with adjacent conductive layers in contact and one of the outer conductive layers of the stack in good thermal contact with a wall of the waveguide.

3. A microwave device as claimed in claim 2 in which an electrical conductor extends in insulating relation through an opening in the wall of the waveguide into contact with the other outer conductive layer of the stack.

4. A microwave device as claimed in claim 1 in which the element comprises two stacks each of at least two wafers of semiconductor material, each wafer or high resistivity having a pair of surface regions each including one of respective opposite faces of the wafer, said regions being of high electrical conductivity of P and N conductivity type respectively with each of said faces supporting a layer of electrically conductive material which serves as a terminal to the wafer, with the wafers in each stack arranged electrically in series with adjacent conductive layers in contact and the two stacks arranged in back-to-back arrangement with an outer conductive layer of one stack in electrical contact with the adjacent outer conductive layer of the other stack.

5. A microwave device as claimed in claim 4 in which the element is mounted in a section of rectangular metal waveguide with the outer conductive layers of the element in efficient thermal contact with respective opposite walls of the waveguide and an electrical conductor extending in insulating relation to the exterior of the waveguide and in contact with the adjacent conductive layers between the two stacks of wafers.

6. A microwave device as claimed in claim 4 in which each wafer is of generally rectangular form.

7. A microwave device as claimed in claim 1 in which the section of waveguide is hermetically sealed by means of bodies of solid dielectric material.

8. A microwave device as claimed in claim 7 in which the section of waveguide is evacuated.

9. A microwave device as claimed in claim 7 in which the section of waveguide is filled with a protective atmosphere.

10. A micro-wave device as claimed in claim 1 in which a plurality of elements are mounted in spaced relation along the section of waveguide.

11. A microwave device comprising a section of coaxial line having inner and outer conductors, a semiconductor junction element mounted in said line in thermal contact with at least said outer conductor, means for applying bias voltages of suitable polarity and magnitude across said junction element to control the impedance of the element to required values between two extreme conditions in which the element is highly conductive and highly resistive, respectively, such that during the operation of the device in the first extreme condition of the element the penetration of micro-wave energy is substantially confined to a minor proportion of the element and the major proportion thereof constitutes a thermally conductive path to the wall of the outer conductor of the coaxial line for heat produced by micro-wave energy dissipated in the minor proportion of the element, and in the second extreme condition a proportion of the element is substantially depleted of current carriers so that the micro-wave energy passes therethrough with substantially negligible absorption.

12. A microwave device as claimed in claim 11 in which the element comprises at least one body of semiconductor high resistivity material having a pair of surface regions each including one of respective opposite faces of the body, said regions being of high electrical conductivity of P and N conductivity type respectively with each of said faces supporting a layer of electrically conductive material which serves as a terminal by which said bias voltages are applied to the body.

13. A micro-wave device as claimed in claim 11 in which said element comprises at least two similar wafers each of semi-conductor high resistivity material having a pair of surface regions each including one of respective opposite faces of the wafer, said regions being of high electrical conductivity of P and N conductivity type respectively with each of said faces supporting a layer of electrically conductive material which serves as a terminal of the wafer, with said wafers arranged electrically in series with a stack with adjacent conductive layers in contact and one of the outer conductive layers of the stack in good thermal contact with a wall of the outer conductor of the line.

14. A micro-wave device as claimed in claim 13 in which an electrical conductor extends in insulating relation through an opening in the wall of the outer conductor of the line into contact with the other outer conductive layer of the stack.

15. A micro-wave device as claimed in claim 11 in which the element comprises two stacks each of at least two wafers of semi-conductor material, each wafer of high resistivity having a pair of surface regions each including one of respective opposite faces of the wafer, said regions being of high electrical conductivity of P and N conductivity type respectively with each of said faces supporting a layer of electrically conductive material which serves as a terminal to the wafers, with the wafers in each stack arranged electrically in series with adjacent conductive layers in contact and the two stacks arranged in back-to-back arrangement with an outer conductive layer of one stack in electrical contact with the adjacent outer conductive layer of the other stack.

16. A micro-wave device as claimed in claim 15, in which the inner surface of the wall of the outer conductor is recessed and the element is mounted therein with an electrical conductor extending in electrically insulating relation to the exterior of the line, in contact with the adjacent conductive layers between the two stacks of wafers.

17. A micro-wave device as claimed in claim 16 in which each wafer is of annular form.

18. A micro-wave device as claimed in claim 11 in which each wafer is of tubular form and is of semi-conductor material of high resistivity having surface regions each including one of respective inner and outer faces of the element, said regions being of high electrical conductivity of P and N conductivity type respectively with each of said faces supporting a layer of electrically conductive material which serves as a terminal by which said bias voltages are applied to the element.

19. A microwave device as claimed in claim 11 in which the section of coaxial line is hermetically sealed by means of bodies of solid dielectric material.

20. A microwave device as claimed in claim 19 in which the section of coaxial line is evacuated.

21. A microwave device as claimed in claim 19 in which the secion of coaxial line is filled with a protective atmosphere.

22. A microwave device as claimed in claim 11 in which a plurality of elements are mounted in spaced relation along the section of coaxial line.

References Cited

UNITED STATES PATENTS

| | | | |
|---|---|---|---|
| 2,882,502 | 4/1959 | Freundlich | 333—98 |
| 2,911,601 | 11/1959 | Gunn et al. | 331—81 |
| 2,930,008 | 3/1960 | Walsh | 333—98 |
| 3,095,550 | 6/1963 | Kilduff | 333—98 |

HERMAN KARL SAALBACH, *Primary Examiner.*

L. ALLAHUT, *Assistant Examiner.*